United States Patent
Kusuda

(10) Patent No.: US 8,295,691 B2
(45) Date of Patent: Oct. 23, 2012

(54) HEAT TREATMENT APPARATUS

(75) Inventor: Tatsufumi Kusuda, Kyoto (JP)

(73) Assignee: Dainippon Screen Mfg Co., Ltd. (JP)

( * ) Notice: Subject to any disclaimer, the term of this patent is extended or adjusted under 35 U.S.C. 154(b) by 981 days.

(21) Appl. No.: 12/334,622

(22) Filed: Dec. 15, 2008

(65) Prior Publication Data

US 2009/0180766 A1 Jul. 16, 2009

(30) Foreign Application Priority Data

Jan. 10, 2008 (JP) ................................. 2008-003130

(51) Int. Cl.
*F26B 19/00* (2006.01)
*A45D 20/40* (2006.01)

(52) U.S. Cl. ......... 392/418; 392/407; 392/416; 392/417

(58) Field of Classification Search .................. 392/407, 392/416, 417, 418
See application file for complete search history.

(56) References Cited

U.S. PATENT DOCUMENTS

| | | | | |
|---|---|---|---|---|
| 6,021,152 A * | 2/2000 | Olsen et al. | ...................... | 372/99 |
| 6,856,762 B2 * | 2/2005 | Kusuda et al. | ................ | 392/416 |
| 7,643,736 B2 * | 1/2010 | Itani | .............................. | 392/416 |
| 7,704,898 B2 * | 4/2010 | Nenyei et al. | ................. | 438/795 |
| 2002/0063123 A1 * | 5/2002 | Sakurai et al. | ................ | 219/497 |
| 2002/0195437 A1 * | 12/2002 | Kusuda | ......................... | 219/390 |
| 2004/0149715 A1 * | 8/2004 | Timans et al. | ................ | 219/390 |
| 2006/0291834 A1 * | 12/2006 | Hauf et al. | ..................... | 392/416 |
| 2008/0069550 A1 * | 3/2008 | Timans et al. | ................ | 392/411 |
| 2009/0175605 A1 * | 7/2009 | Kobayashi | ..................... | 392/416 |
| 2009/0245761 A1 * | 10/2009 | Nakajima | ..................... | 392/416 |

FOREIGN PATENT DOCUMENTS

| | | |
|---|---|---|
| JP | 2002-100583 | 4/2002 |
| JP | 2002-299275 | 10/2002 |
| JP | 2004-140318 | 5/2004 |

* cited by examiner

*Primary Examiner* — Thor Campbell
(74) *Attorney, Agent, or Firm* — Ostrolenk Faber LLP

(57) ABSTRACT

In a heat treatment apparatus, a substrate held by a holding part is irradiated with light emitted from halogen lamps to perform preheating thereon and irradiated with a flash of light emitted from flash lamps to perform flash heating thereon. Part of light which is emitted from the halogen lamps and goes toward the flash lamps passes through a window hole formed in a peripheral-light shielding member and enters the substrate held by the holding part, and its energy is used for the preheating on the substrate. On the other hand, the remaining light is blocked out by the peripheral-light shielding member.

10 Claims, 5 Drawing Sheets

HEAT TREATMENT APPARATUS

BACKGROUND OF THE INVENTION

1. Field of the Invention

The present invention relates to a heat treatment apparatus for irradiating a substrate including a semiconductor wafer, a glass substrate for a liquid crystal display device and the like with light to perform a heat treatment on the substrate, and more particularly to a heat treatment apparatus for emitting a flash of light to momentarily heat the substrate.

2. Description of the Background Art

Conventionally, a lamp annealer employing a halogen lamp has been typically used in the step of activating ions in a substrate after ion implantation. Such a lamp annealer carries out the activation of ions in the substrate by heating (or annealing) the substrate to a temperature of, e.g., about 1000° C. to 1100° C. Such a heat treatment apparatus utilizes the energy of light emitted from the halogen lamp to raise the temperature of the substrate at a rate of about hundreds of degrees per second.

In recent years, with the increasing degree of integration of semiconductor devices, it has been desired to provide a shallower junction as the gate length decreases. It has turned out, however, that even the execution of the process of activating ions in a substrate by the use of the above-mentioned lamp annealer which raises the temperature of the substrate at a rate of about hundreds of degrees per second produces a phenomenon in which the ions of boron, phosphorus and the like implanted in the substrate are diffused deeply by heat. The occurrence of such a phenomenon causes the depth of the junction to exceed a required level, giving rise to apprehension about a hindrance to good device formation.

To solve the problem, there has been proposed a technique for irradiating a surface of a substrate with a flash of light by using a xenon flash lamp or the like to raise the temperature of only the surface of the substrate, which is implanted with ions, in an extremely short time (several milliseconds or less). The xenon flash lamp has a spectral distribution of radiation ranging from ultraviolet to near-infrared regions. The wavelength of light emitted from the xenon flash lamp is shorter than that of light emitted from the conventional halogen lamp, and almost coincides with a fundamental absorption band of a silicon substrate. It is therefore possible to quickly raise the temperature of the substrate, with a small amount of light transmitted through the substrate, when the substrate is irradiated with a flash of light emitted from the xenon flash lamp. Also, it has turned out that the flash light irradiation in an extremely short time of several milliseconds or less can selectively raise the temperature of only near the surface of the substrate. Therefore, the temperature rise in an extremely short time by using the xenon flash lamp allows the execution of only the ion activation without deep diffusion of the ions. Such a constitution example of heat treatment apparatus employing a xenon flash lamp is shown in, e.g., Japanese Patent Application Laid Open Gazette No. 2004-140318.

Before flash heating using the xenon flash lamp, preheating is performed on the substrate by using a hot plate, a halogen lamp or the like. Though the hot plate has the advantage of being safe and raising the temperature of the substrate uniformly to some degree, it limits the scope of application since it has a limitation of possible raised temperature. On the other hand, using the halogen lamp allows a rise in temperature of 600 degrees or more. If it is possible to preliminarily raise the temperature of the substrate to a high-temperature range of 600 degrees or more before the flash heating, the range of temperature rise required for the flash heating can be thereby reduced. In other words, the energy to be given to the substrate by the xenon flash lamp can be reduced. This reduces the thermal stress imposed on the substrate in the flash heating, and it is thereby possible to prevent the substrate from being broken by the flash heating.

In the apparatus employing a halogen lamp to perform the preheating, however, a tube wall of a xenon flash lamp absorbs rays of light emitted from the halogen lamp in the preheating and this disadvantageously raises the temperature of the tube wall. Since the life of the xenon flash lamp depends on the temperature of its tube wall, the rise in temperature of the tube wall remarkably deteriorates the flash lamp.

SUMMARY OF THE INVENTION

The present invention is intended for a heat treatment apparatus for irradiating a substrate with light to heat the substrate. According to an aspect of the present invention, the heat treatment apparatus comprises a holding part for holding a substrate, a first light emitting part comprising a plurality of halogen lamps for emitting light toward a substrate held by the holding part from a position away from the substrate by a predetermined distance, a second light emitting part comprising a plurality of flash lamps for emitting a flash of light toward a substrate held by the holding part from a position away from the substrate by a predetermined distance, and a peripheral-light shielding part inserted between the first light emitting part and the holding part, for passing part of light which is emitted from the first light emitting part and goes toward the second light emitting part therethrough to let it enter a substrate held by the holding part while blocking out the remaining light.

In the constitution of the heat treatment apparatus of the present invention, the light which is emitted from the first light emitting part and goes toward the holding part is blocked out by the substrate held by the holding part or the peripheral-light shielding part and therefore never reach the second light emitting part. This suppresses deterioration of the flash lamps due to the effect of the rays of light emitted from the halogen lamps.

According to another aspect of the present invention, the heat treatment apparatus comprises a holding part for holding a substrate, a first light emitting part comprising a plurality of halogen lamps for emitting light toward a substrate held by the holding part from a position away from the substrate by a predetermined distance, a second light emitting part comprising a plurality of flash lamps for emitting a flash of light toward a substrate held by the holding part from a position away from the substrate by a predetermined distance, and a peripheral-light shielding part inserted between the second light emitting part and the holding part, for blocking out light which is emitted from the first light emitting part, not entering a substrate held by the holding part, and goes toward the second light emitting part.

Preferably, the peripheral-light shielding part comprises a plate-like member inserted in parallel with a substrate held by the holding part, and the plate-like member comprises a window hole formed in its surface area, having substantially the same size as a projection image of the substrate, which is orthographically projected on the surface area.

Preferably, the separation distance between the plate-like member and a substrate held by the holding part is not longer than 30 mm.

Preferably, the plate-like member is formed of silicon carbide.

Preferably, the plate-like member is formed of alumina.

Preferably, the plate-like member is formed of a material that does not transmit light of visible region.

Therefore, it is an object of the present invention to provide a technique to suppress deterioration of flash lamps due to the effect of halogen lamps in a heat treatment apparatus which employs the halogen lamps and the flash lamps to perform a heat treatment on a substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, discussion will be made on a heat treatment apparatus of the preferred embodiment of the present invention with reference to figures. A heat treatment apparatus 100 of the preferred embodiment of the present invention is a flash lamp annealing apparatus for irradiating a substantially circular substrate W with a flash of light to heat the substrate W.

<1. Overall Structure of Heat Treatment Apparatus>

Figure 1:
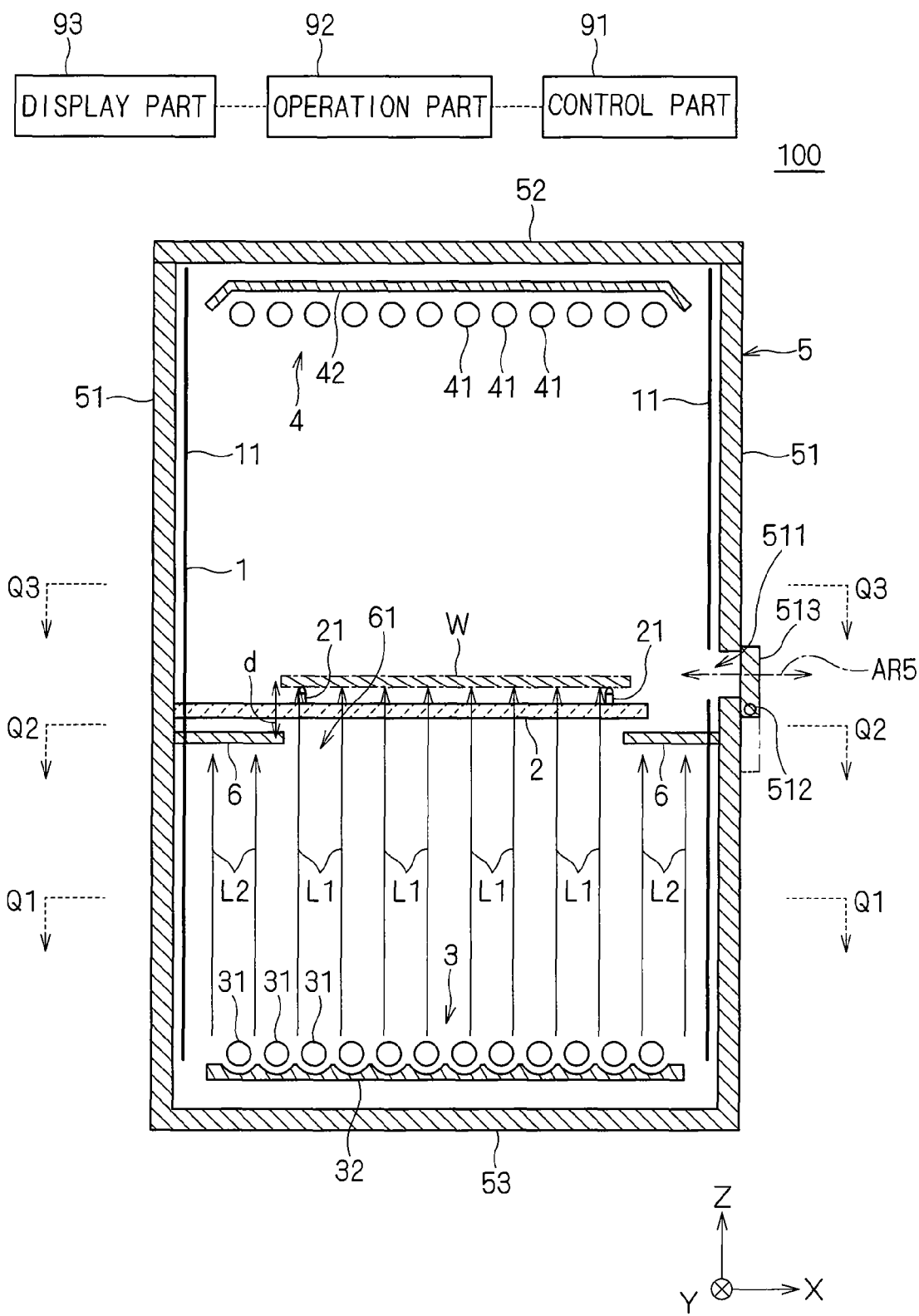
FIG. 1 is a sectional side view showing a construction of a heat treatment apparatus.
Figure 2A:
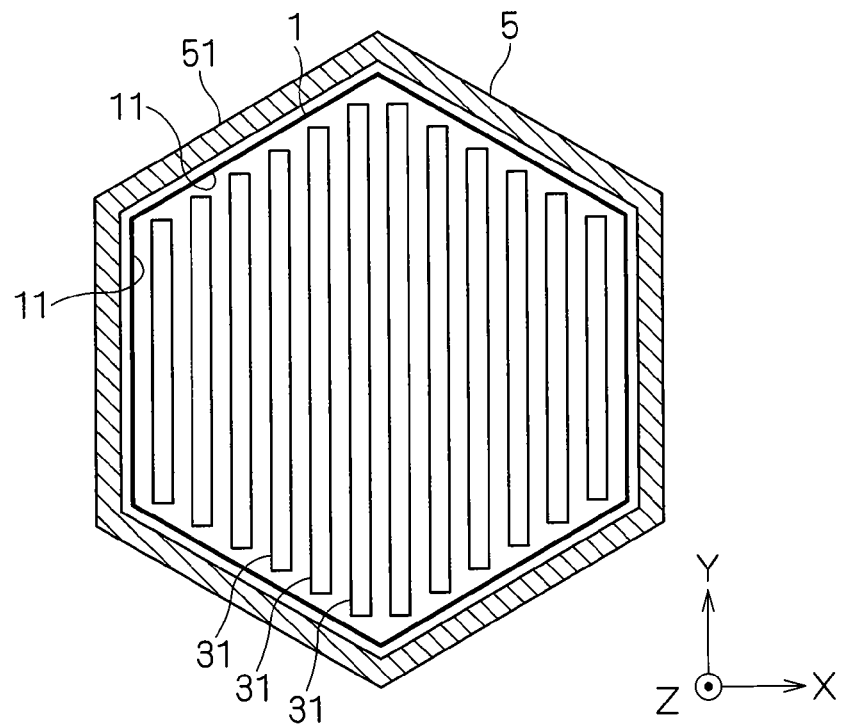
FIGS. 2A and 2B are longitudinal sections each showing the construction of the heat treatment apparatus.
Figure 2B:
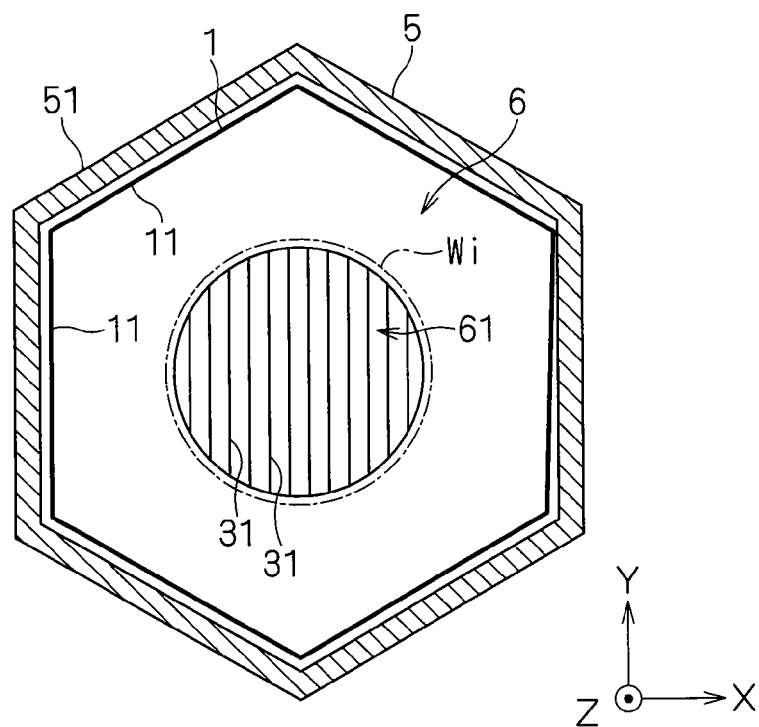
Figure 3A:
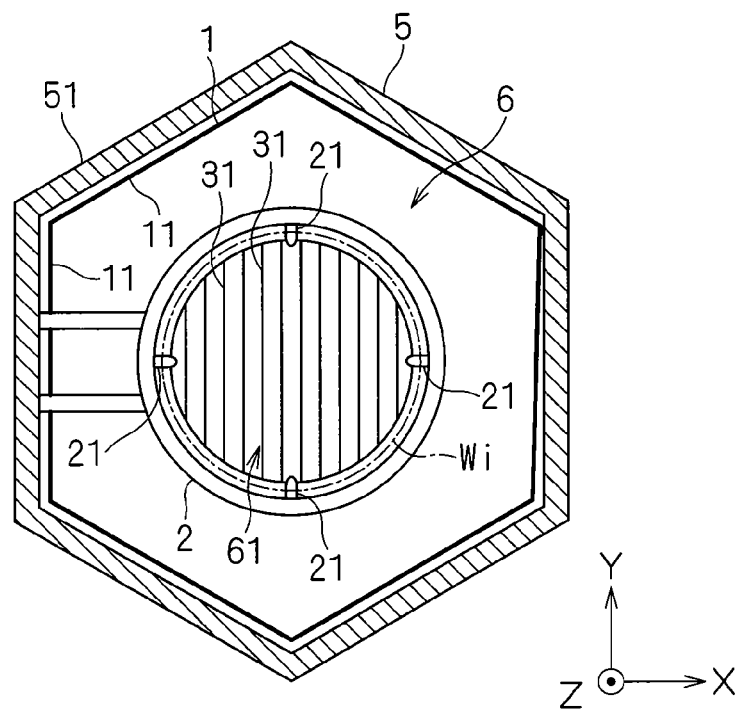
FIGS. 3A and 3B are longitudinal sections each showing the construction of the heat treatment apparatus.
Figure 3B:
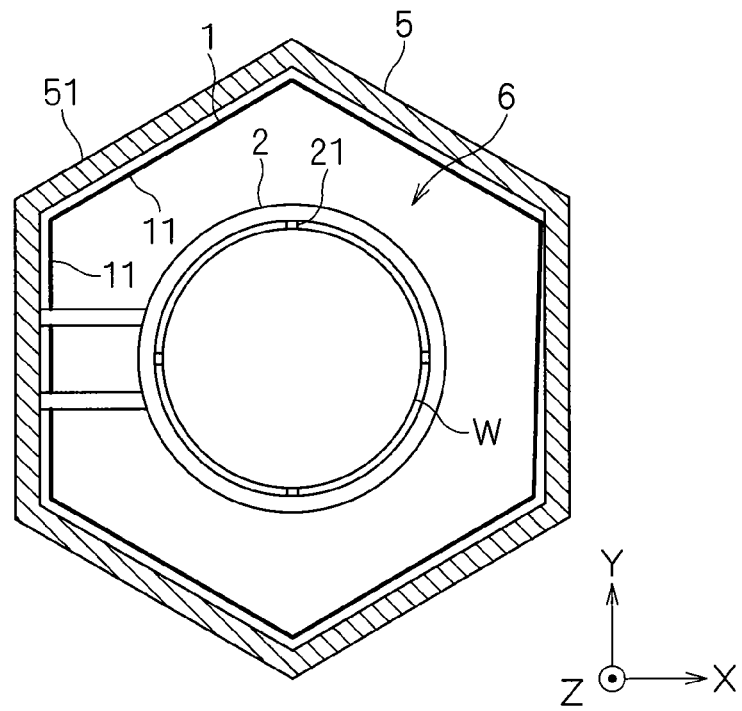

First, an overall structure of the heat treatment apparatus of the preferred embodiment of the present invention will be discussed with reference to FIGS. 1, 2A, 2B, 3A and 3B. FIG. 1 is a sectional side view showing a construction of the heat treatment apparatus 100. FIGS. 2A and 2B are longitudinal sections of the heat treatment apparatus 100 as viewed from the direction of arrows Q1 and Q2 of FIG. 1, respectively. FIGS. 3A and 3B are longitudinal sections of the heat treatment apparatus 100 as viewed from the direction of an arrow Q3 of FIG. 1, showing a state where no substrate W is held by a holding part 2 discussed later and a state where a substrate W is held by the holding part 2, respectively.

The heat treatment apparatus 100 comprises a reflection body 1 formed of six reflecting plates 11 in a hexagonal tube. Each reflecting plate 11 is formed of a material having a sufficiently high reflectance (e.g., aluminum or the like). Alternatively, an inner surface thereof is coated for improving reflectance (e.g., non-diffusion coated with gold). Part of light emitted from light emitting parts 3 and 4 discussed later is reflected on the inner surface of the reflecting plates 11 and enters a substrate W held by the holding part 2 discussed later. Light energy generated from the light emitting parts 3 and 4 are thereby used without waste for heat treatment on the substrate W.

The heat treatment apparatus 100 comprises the holding part 2 for horizontally holding the substrate W inside the tube of the reflection body 1. The holding part 2 is a ring-shaped member having a diameter slightly larger than the diameter of the substrate W, and a plurality of (e.g., four) supporting members 21 for supporting a back surface of the substrate W by points are formed on its inner end surface. The substrate W held by the holding part 2 is supported by these supporting members 21 from the back surface side.

Further, the heat treatment apparatus 100 comprises two light emitting parts 3 and 4 disposed inside the tube of the reflection body 1, for irradiating the substrate W held by the holding part 2 with light to heat the substrate W.

The first light emitting part 3 emits light toward the substrate W from a position below the substrate W held by the holding part 2, away from it by 100 mm or more. Then, its light energy raises the temperature of the substrate W to a predetermined preheating temperature (e.g., 600° C.). The first light emitting part 3 has a plurality of halogen lamps 31 and a reflector 32. A plurality of halogen lamps 31 are each a long-length cylindrical rod lamp and are arranged in plane with these longitudinal directions parallel to one another. The reflector 32 is so provided below these halogen lamps 31 as to cover entire these lamps, with its surface roughened by abrasive blasting to have a satin finish thereon.

The halogen lamp 31 is a filament-type light source in which a filament provided inside a glass tube is energized to be incandesced for irradiation. The inside of the glass tube is filled with an inert gas such as nitrogen, argon or the like with a very small amount of halogen element (e.g., iodine or bromine) introduced. Introduction of the halogen element suppresses breakage of the filament and allows the temperature of the filament to be set high. Therefore, the halogen lamp 31 has a characteristic feature that ensures longer life and continuous irradiation with light of higher intensity as compared with a normal incandescent lamp.

The second light emitting part 4 emits a flash of light toward the substrate W (more specifically, the substrate W after being preheated by the first light emitting part 3) from a position above the substrate W held by the holding part 2, away from it by 100 mm or more. Then, its light energy raises the temperature of a surface of the substrate W in a short time. The second light emitting part 4 has a plurality of (e.g., thirty) xenon flash lamps (hereinafter, referred to simply as "flash lamps") 41 and a reflector 42. A plurality of flash lamps 41 are each a long-length cylindrical rod lamp and are arranged in plane with these longitudinal directions parallel to one another. The reflector 42 is so provided above these flash lamps 41 as to cover entire these lamps, with its surface roughened by abrasive blasting to have a satin finish thereon.

The xenon flash lamp 41 comprises a glass tube which is filled with xenon gas and provided with an anode and a cathode connected to a capacitor at its both ends and a trigger electrode coiled around the outer peripheral surface of the glass tube. Since the xenon gas is an electrical insulator, no electricity flows in the glass tube in a normal state. In a case where a high voltage is applied to the trigger electrode to break the insulation, however, the electricity accumulated in the capacitor quickly flows into the glass tube and light is emitted by excitation of atoms or molecules of the xenon at that time. The xenon flash lamp 41, in which the electrostatic energy accumulated in advance is converted into an extremely short light pulse ranging from 0.1 to 10 milliseconds, has a characteristic feature of emitting an extremely intense light as compared with a light source of successive lighting.

Between the light emitting parts 3 and 4 and the holding part 2, an atmosphere cutoff member may be provided to arrange the light emitting parts 3 and 4 and the substrate W held by the holding part 2 in separate spaces. The atmosphere cutoff member, however, needs to be formed of a material (e.g., quartz) that transmits light therethrough. By providing the atmosphere cutoff member, it is possible to prevent the substrate W held by the holding part 2 from being contaminated by particles and the like generated in the light emitting parts 3 and 4.

The heat treatment apparatus 100 further comprises a hexagonal tube-like chamber 5 covering the reflection body 1. The chamber 5 consists of a hexagonal tube-like chamber side portion 51 surrounding the reflection body 1, a chamber cover portion 52 covering the upper portion of the chamber side portion 51 and a chamber bottom portion 53 covering the lower portion of the chamber side portion 51. The chamber side portion 51 is provided with a transport opening 511 for the transport of the substrate W therethrough into and out of the chamber 5. The transport opening 511 is openable and closable by a gate valve 513 pivoting about an axis 512. The transport opening 511 is formed to penetrate also a side wall surface of the reflection body 1, and when the gate valve 513 is positioned at an opening position (the position indicated by a virtual line in FIG. 1), the substrate W may be loaded into or unloaded from the inside of the tube of the reflection body 1 through the transport opening 511 (indicated by an arrow AR5). On the other hand, when the gate valve 513 is positioned at a closing position (the position indicated by a solid line in FIG. 1), the inside of the chamber 5 becomes a sealed space.

The heat treatment apparatus 100 still further comprises a peripheral-light shielding member 6 which passes part of the light that is emitted from the halogen lamps 31 of the first light emitting part 3 and goes toward the flash lamps 41 of the second light emitting part 4 therethrough to let it enter the substrate held by the holding part 2 while blocking out the remaining light. More specific description will be made later on the peripheral-light shielding member 6.

Furthermore, the heat treatment apparatus 100 comprises a control part 91 for controlling these above-described constituent elements, an operation part 92 and a display part 93 which serve as a user interface. The operation part 92 and the display part 93 are provided outside the chamber 5 and receive various instructions from users outside the chamber 5. The control part 91 controls these constituent elements of the heat treatment apparatus 100 on the basis of the various instructions inputted from the operation part 92 and the display part 93.

<2. Peripheral-Light Shielding Member 6>

Subsequently, more specific description on the peripheral-light shielding member 6 will be made also with reference to FIGS. 1, 2A, 2B, 3A and 3B. As shown in FIG. 1, the peripheral-light shielding member 6 is a plate-like member inserted between the holding part 2 and the first light emitting part 3, at a position away from the substrate W held by the holding part 2 by a predetermined distance, and is fixed to an inner wall surface of the chamber 5, with its surface substantially parallel to the surface of the substrate W held by the holding part 2.

Herein, it is preferable that the separation distance d between the substrate W held by the holding part 2 and the peripheral-light shielding member 6 should be as short as possible (e.g., 30 mm or shorter). Since part of the light emitted from the halogen lamps 31 goes straight toward the flash lamps 41 and the remaining light is reflected on the reflecting plates 11 and the like with the intention of reaching the flash lamps 41, as the separation distance d between the substrate W and the peripheral-light shielding member 6 becomes longer, more reflected light reaches the flash lamps 41, weaving its way between the substrate W and the peripheral-light shielding member 6. Conversely, if the peripheral-light shielding member 6 is disposed as closely as possible to the substrate W held by the holding part 2, since the substrate W and the peripheral-light shielding member 6 serve as one wall as a whole, it becomes possible to prevent not only direct light but also reflected light from reaching the flash lamps 41.

The peripheral-light shielding member 6 is provided with its entire periphery attached to the inner wall surface of the chamber 5 so as to prevent a leak of light emitted from the halogen lamps 31 from between the its periphery and the chamber side portion 51 (see FIG. 2B). Further, a surface area of the peripheral-light shielding member 6 is provided with a window hole 61 having substantially the same size as an orthographic projection image Wi of the substrate W held by the holding part 2, which is formed in the surface area. Herein, "substantially the same" means that the window hole 61 may be smaller than the orthographic projection image Wi with an error of 1 to 2 mm. In other words, though it is preferable that the window hole 61 should have the same size as the orthographic projection image Wi, the window hole 61 may be smaller than the orthographic projection image Wi and as shown in FIGS. 2B and 3A, for example, the periphery of the window hole 61 may be disposed inward by about 1 to 2 mm from the periphery of the orthographic projection image Wi.

The peripheral-light shielding member 6 is formed of a material (e.g., silicon carbide (SiC), alumina ($Al_2O_3$), quartz or the like) that does not transmit light of absorption region (mainly, infrared region) of quartz glass which is a material of which the tube wall of the flash lamp 41 is formed.

Part of the light which is emitted from the halogen lamps 31 and goes toward the flash lamps 41 (especially, light of the absorption region of the material of which the tube wall of the flash lamp 41 is formed) enters the substrate W held by the holding part 2, through the window hole 61, and is absorbed by the substrate W (rays of light L1). The remaining light is blocked out by the peripheral-light shielding member 6 (rays of light L2). Therefore, the light emitted from the halogen lamps 31, going toward the flash lamps 41, never reach the tube walls of the flash lamps 41. This suppresses rise in temperature of the tube walls of the flash lamps 41 due to absorption of the light. In other words, it is possible to prevent deterioration of the flash lamps 41.

Especially, if the peripheral-light shielding member 6 is formed of a material (e.g., silicon carbide) that is easier to warm than the substrate W, the temperature of the peripheral-light shielding member 6 rises more quickly than the substrate W by irradiation of light from the halogen lamps 31. Therefore, in this case, a peripheral area of the substrate W can be warmed indirectly through the peripheral-light shielding member 6. It is possible to produce an effect of suppressing breakage of the substrate W by warming the peripheral area of the substrate W.

Still especially, if the peripheral-light shielding member 6 is formed a material (e.g., alumina) that is harder to warm than the substrate W, the temperature of the peripheral-light shielding member 6 rises more slowly than the substrate W by irradiation of light from the halogen lamps 31. Therefore, in this case, the peripheral area of the substrate W can be warmed more slowly than other areas.

Further especially, if the peripheral-light shielding member 6 is formed by a material that does not transmit light of visible region, since the light of visible region emitted from the halogen lamps 31 is blocked out by the peripheral-light shielding member 6 or the substrate W, no light leaks out to the space between the substrate W held by the holding part 2 and the second light emitting part 4. In a case, for example, where such a peripheral-light shielding member 6 is adopted in an apparatus for detecting the surface temperature of the substrate W held by the holding part 2 by using a camera, since the light from the halogen lamps 31 never enter the camera for detection of the temperature, it is possible to perform a correct detection of the temperature.

<3. Operation of Heat Treatment Apparatus>

Figure 4:
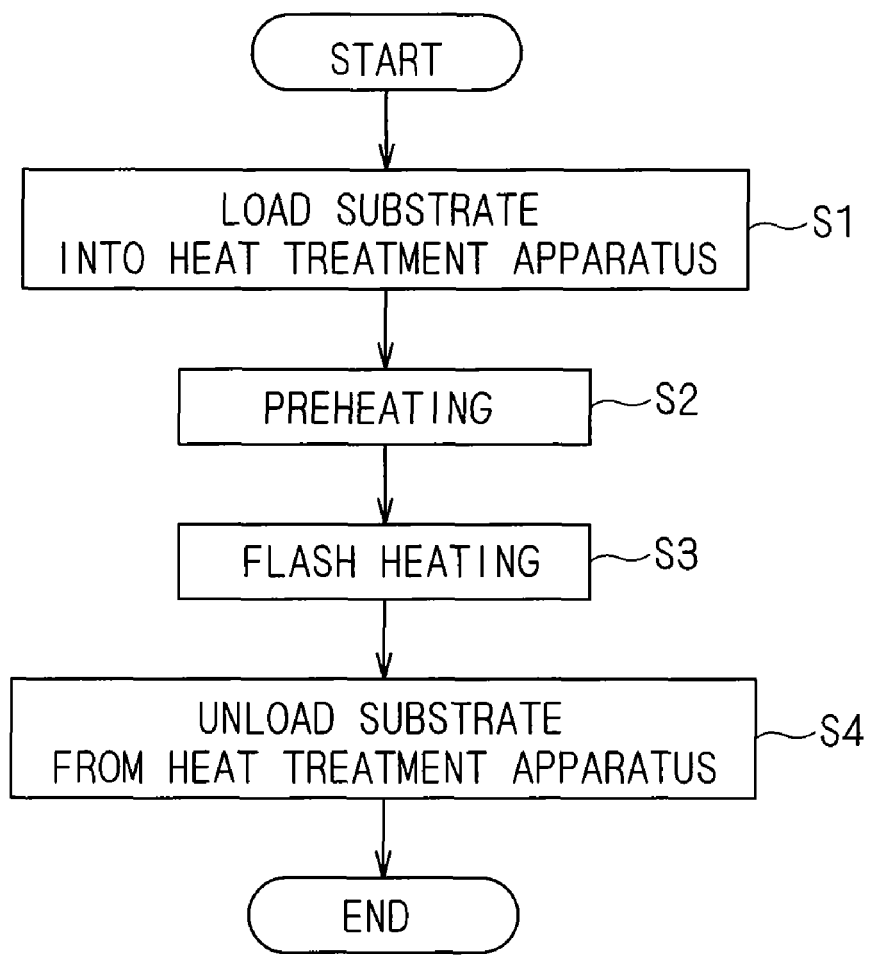
FIG. 4 is a flowchart showing a flow of operation performed by the heat treatment apparatus.

Next, discussion will be made on a procedure for processing substrates W in the heat treatment apparatus 100 with reference to FIG. 4. FIG. 4 is a flowchart showing a flow of operation performed by the heat treatment apparatus 100. Herein, the substrate W to be processed is a semiconductor substrate doped with impurities by ion implantation, and the doped impurities are activated by the heat treatment in the heat treatment apparatus 100. The following process operation is performed through controls of these constituent elements by the control part 91 at predetermined timings.

First, a substrate W doped with ions is loaded into the inside of the heat treatment apparatus 100 (Step S1). More specifically, the control part 91 controls a driving means (now shown) to put the gate valve 513 at the opening position. This opens the transport opening 511. Subsequently, a transfer robot outside the apparatus loads the substrate W doped with ions into the inside of the chamber 5 through the transport opening 511 and puts it on the holding part 2. After the substrate W is put on the holding part 2, the control part 91 controls the not-shown driving means again to put the gate valve 513 at the closing position. This closes the transport opening 511 and the inside of the chamber 5 becomes a sealed space.

Next, the substrate W held by the holding part 2 is preheated (Step S2). More specifically, the control part 91 controls the first light emitting part 3 to emit light toward the substrate W held by the holding part 2. With this light energy, the temperature of the substrate W is raised to a predetermined preheating temperature. At that time, the light emitted from the halogen lamps 31 of the first light emitting part 3 goes directly, or being reflected on the reflecting plates 11, the reflector 32 and the like, toward the substrate W held by the holding part 2, and this light irradiation allows preheating of the substrate W.

Specifically, part of the light which is emitted from the halogen lamps 31 and goes toward the flash lamps 41 (e.g., rays of light L1 (FIG. 1)) passes through the window hole 61 formed in the peripheral-light shielding member 6 and enters the substrate W held by the holding part 2, and its energy is used for preheating of the substrate W. On the other hand, the remaining light (e.g., rays of light L2 (FIG. 1)) is blocked out by the peripheral-light shielding member 6. Therefore, the light which is emitted from the halogen lamps 31 and goes toward the flash lamps 41 never reach the tube walls of the flash lamps 41. Further, since the peripheral-light shielding member 6 is disposed closely to the substrate W held by the holding part 2, as discussed above, not only the straight light but also the reflected light is hard to reach the flash lamps 41.

After the preheating is completed, subsequently, the substrate W held by the holding part 2 is flash heated (Step S3). More specifically, the control part 91 controls the second light emitting part 4 to emit a flash of light toward the substrate W held by the holding part 2. With this light energy, the temperature of the substrate W is raised to a predetermined process heating temperature. At that time, part of light emitted from the flash lamps 41 of the second light emitting part 4 goes directly toward the substrate W held by the holding part 2, and the remaining light is once reflected on the reflecting plates 11, the reflector 42 and the like and then goes toward the substrate W. This flash light irradiation allows flash heating of the substrate W.

Further, since the flash heating is performed by flash light irradiation from the flash lamps 41, it is possible to raise the surface temperature of the substrate W in a short time. Specifically, a flash of light emitted from the flash lamp 41 of the second light emitting part 4 is an extremely short and intense flash light whose irradiation time ranges from about 0.1 to 10 milliseconds, with its electrostatic energy accumulated in advance being converted into an extremely short light pulse. Then, the surface temperature of the substrate W which is flash heated by the flash light irradiation from the flash lamps 41 momentarily rises to a predetermined process temperature (e.g., about 1000° C. to 1100° C.), and after activation of the impurities doped in the substrate W, the surface temperature quickly falls. Thus, in the heat treatment apparatus 100, since the surface temperature of the substrate W can be raised and dropped in an extremely short time, it is possible to activate the impurities doped in the substrate W while suppressing diffusion of the impurities in the substrate W by heat (this diffusion is sometimes referred to as "broadening of profile of impurities in the substrate W"). Further, since the time required for activation of doped impurities is so much shorter than the time required for thermal diffusion thereof, the activation can be completed even in a short time ranging from about 0.1 to 10 milliseconds where no diffusion occurs.

Furthermore, by the preheating of the substrate W performed by the first light emitting part 3 before the flash heating, it is possible to easily raise the surface temperature of the substrate W to the process temperature by the flash light irradiation from the flash lamps 41. Especially, in this preferred embodiment, since the preheating is performed by using the halogen lamps 31, the temperature of the substrate W can be preliminarily raised to a higher-temperature range (e.g., 600 degrees or more) as compared with a case of using a hot plate or the like. This reduces the range of temperature rise in the flash heating, and it is thereby possible to prevent the substrate from being broken by the flash heating.

After the flash heating is completed, the substrate W is unloaded from the heat treatment apparatus 100 (Step S4). More specifically, the control part 91 controls the not-shown driving means to put the gate valve 513 at the opening position. Subsequently, the transfer robot outside the apparatus unloads the substrate W from the inside of the chamber 5 through the transport opening 511. This completes the processing of the substrate W in the heat treatment apparatus 100.

<4. Effects>

In the above-discussed preferred embodiment, the peripheral-light shielding member 6 passes part of the light which is emitted from the halogen lamps 31 of the first light emitting part 3 and goes toward the flash lamps 41 of the second light emitting part 4 (e.g., the rays of light L1 (FIG. 1)) therethrough to let it enter the substrate W held by the holding part 2 while blocking out the remaining light (e.g., the rays of light L2 (FIG. 1)). In other words, among the straight light emitted from the halogen lamps 31, part of the light L1 is blocked out by the substrate W and the remaining light L2 is blocked out by the peripheral-light shielding member 6, and therefore the straight light from the halogen lamps 31 never reach the flash lamps 41. Further, since the peripheral-light shielding member 6 is disposed closely to the substrate W held by the holding part 2, not only the straight light but also the reflected light is hard to reach the flash lamps 41. This suppresses the rise in temperature of the tube walls of the flash lamps 41 (more specifically, the rise in temperature due to absorption of the rays of light from the halogen lamps 31). It is thereby possible to suppress deterioration of the flash lamps 41.

<5. Variations>

Figure 5:
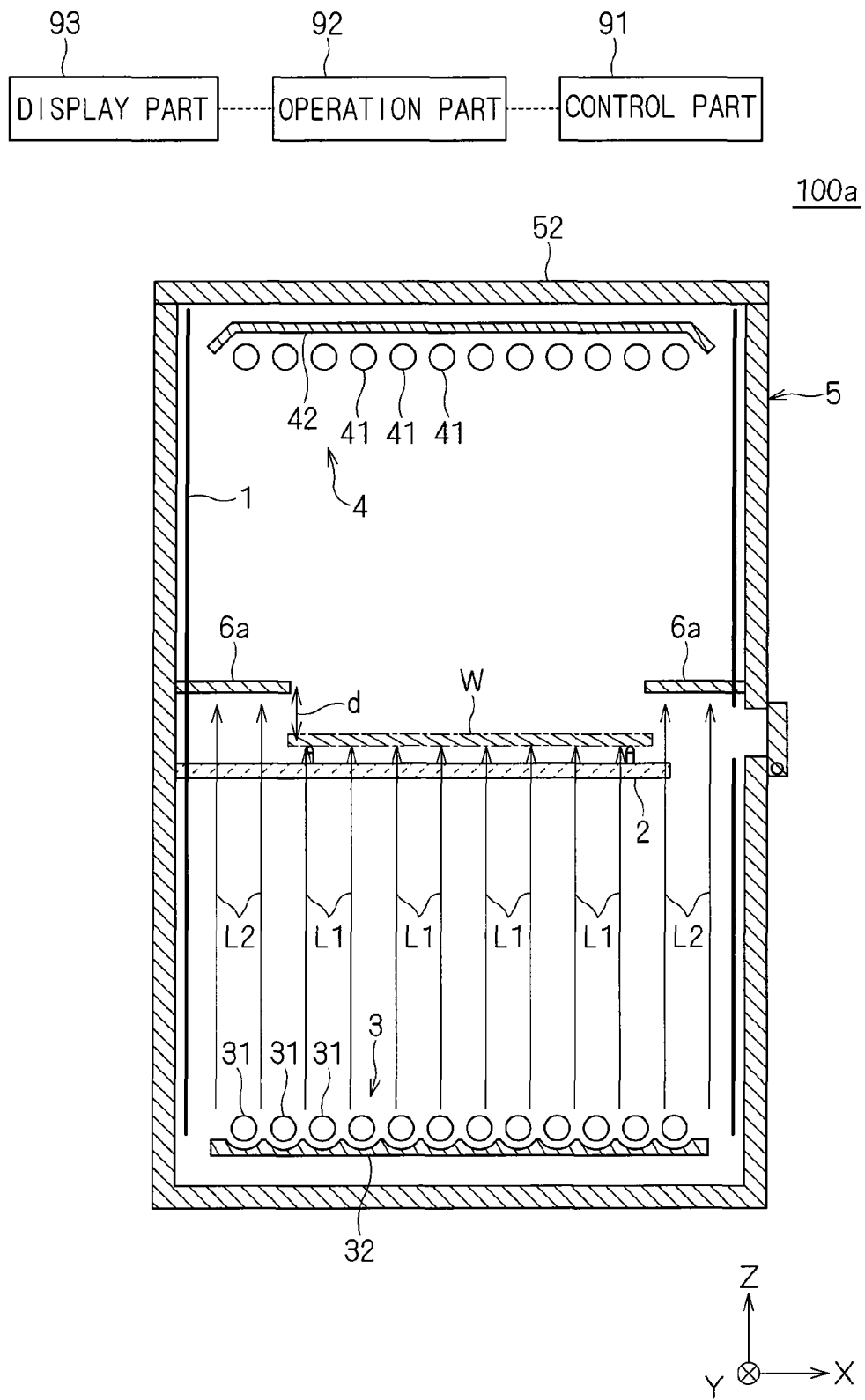
FIG. 5 is a sectional side view showing a construction of a heat treatment apparatus in accordance with a variation.

Tough the peripheral-light shielding member 6 is inserted between the holding part 2 and the first light emitting part 3 in the heat treatment apparatus 100 of the above-discussed preferred embodiment, the peripheral-light shielding member 6 may be inserted between the holding part 2 and the second light emitting part 4. FIG. 5 is a sectional side view showing a construction of a heat treatment apparatus 100*a* in accordance with this variation. In FIG. 5, the constituent elements identical to those in the heat treatment apparatus 100 of the above-discussed preferred embodiment are represented by the same reference signs.

The heat treatment apparatus 100*a* of this variation comprises a peripheral-light shielding member 6*a* for blocking out the light which is emitted from the halogen lamps 31 of the first light emitting part 3 and goes toward the flash lamps 41 of the second light emitting part 4, not entering the substrate W held by the holding part 2.

The peripheral-light shielding member 6*a* has the same constitution as the peripheral-light shielding member 6 in the heat treatment apparatus 100 of the above-discussed preferred embodiment. While the peripheral-light shielding member 6 is inserted between the holding part 2 and the first light emitting part 3, however, the peripheral-light shielding member 6*a* is inserted between the holding part 2 and the second light emitting part 4, differently from the above. Specifically, the peripheral-light shielding member 6*a* is a plate-like member inserted between the holding part 2 and the second light emitting part 4, at a position away from the substrate W held by the holding part 2 by a predetermined distance, and is fixed to the inner wall surface of the chamber 5, with its surface substantially parallel to the surface of the substrate W held by the holding part 2. For the same reason as discussed in the above preferred embodiment, also in this variation, it is preferable that the separation distance d between the substrate W held by the holding part 2 and the peripheral-light shielding member 6*a* should be as short as possible.

Also in this variation, part of the light emitted from the halogen lamps 31 and goes toward the flash lamps 41 enters the substrate W held by the holding part 2 and is absorbed by the substrate W (e.g., the rays of light L1). The remaining light is blocked out by the peripheral-light shielding member 6*a* (e.g., the rays of light L2). Therefore, the light which is emitted from the halogen lamps 31 and goes toward the flash lamps 41 never reach the tube walls of the flash lamps 41. This suppresses the rise in temperature of the tube walls of the flash lamps 41 due to absorption of the light, and it is thereby possible to prevent deterioration of the flash lamps 41.

Discussion will be made on other variations. Though it is preferable that the separation distance d between the substrate W held by the holding part 2 and the peripheral-light shielding member 6 should be as short as possible in the heat treatment apparatus 100 of the above-discussed preferred embodiment, especially, the separation distance d may be "0". Specifically, before starting the heat treatments on the substrate W (Steps S2 and S3 (FIG. 4)), the substrate W and the peripheral-light shielding member 6 may be arranged in one plane. In order to achieve this construction, for example, the supporting members 21 of the holding part 2 have only to be set vertically movable (for example, the supporting members 21 are connected to a driving mechanism or the like for driving the supporting members 21 movable up and down). In the case of using the peripheral-light shielding member 6*a* of the above variation, for example, before performing the heat treatments, the supporting members 21 are moved up to raise the substrate W held by the supporting members 21 to the same level (plane) as the peripheral-light shielding member 6*a*, and the separation distance d is thereby made "0". Alternatively, a constituent element for driving the peripheral-light shielding member 6*a* movable up and down may be provided. In this case, before performing the heat treatments, the peripheral-light shielding member 6*a* is moved down to the same level (plane) as the substrate W held by the holding part 2, and the separation distance d is thereby made "0".

Further, though the reflection body 1 is formed of six reflecting plates 11 in a hexagonal tube in the heat treatment apparatus 100 of the above-discussed preferred embodiment, the shape of the reflection body 1 is not limited to this tube shape but the reflection body 1 may be formed of n reflecting plates 11 (n is an integer not less than 3) in any polygonal tube. Alternatively, the reflection body 1 may be formed of one reflecting plate 11 in a cylindrical shape.

Furthermore, though both the two light emitting parts 3 and 4 are disposed away from the substrate W held by the holding part 2 by 100 mm or more in the heat treatment apparatus 100 of the above-discussed preferred embodiment, both the light emitting parts 3 and 4 may not be necessarily disposed away from the substrate W by 100 mm or more.

Though the first light emitting part 3 and the second light emitting part 4 each comprise a plurality of rod-like light sources (the halogen lamps 31, the flash lamps 41) in the heat treatment apparatus 100 of the above-discussed preferred embodiment, the light source may not necessarily have a rod-like shape. A spiral-shaped light source, for example, may be used. Alternatively, a plurality of point light sources may be arranged regularly. Still alternatively, a plurality of ring-like light sources having different diameters may be arranged concentrically.

Further, though the holding part 2 is a ring-shaped member to support the substrate W in the heat treatment apparatus 100 of the above-discussed preferred embodiment, the manner of holding the substrate W is not limited to this type. For example, a plate-like member (e.g., a stage formed of quartz) may be used to support the substrate W (plane supporting). Alternatively, such a plate-like member may be further provided with a plurality of support pins to support the substrate W (point supporting). Still alternatively, the substrate W may be supported by a hand having any of various shapes.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for irradiating a substrate with light to heat the substrate, comprising:

a holding part for holding a substrate;

a first light emitting part comprising a plurality of halogen lamps for emitting light toward a substrate held by said holding part from a position away from said substrate by a predetermined distance;

a second light emitting part comprising a plurality of flash lamps for emitting a flash of light toward a substrate held by said holding part from a position away from said substrate by a predetermined distance; and a peripheral-light shielding part inserted between said first light emitting part and said holding part, for passing part of light which is emitted from said first light emitting part and goes toward said second light emitting part therethrough to let the part of light enter a substrate held by said holding part, while blocking out the remaining light;

said peripheral-light shielding part comprises:

a plate-like member inserted in parallel with a substrate held by said holding part, and said plate-like member comprises a window hole formed in its surface area, having a size equal to or smaller than that of a projection image of said substrate, which is orthographically projected on the surface area.

2. The heat treatment apparatus according to claim 1, wherein
the separation distance between said plate-like member and a substrate held by said holding part is not longer than 30 mm.

3. The heat treatment apparatus according to claim 2, wherein
said plate-like member is formed of silicon carbide.

4. The heat treatment apparatus according to claim 2, wherein
said plate-like member is formed of alumina.

5. The heat treatment apparatus according to claim 2, wherein
said plate-like member is formed of a material that does not transmit light of visible region.

6. A heat treatment apparatus for irradiating a substrate with light to heat the substrate, comprising:
a holding part for holding a substrate;
a first light emitting part comprising a plurality of halogen lamps for emitting light toward a substrate held by said holding part from a position away from said substrate by a predetermined distance;
a second light emitting part comprising a plurality of flash lamps for emitting a flash of light toward a substrate held by said holding part from a position away from said substrate by a predetermined distance; and
a peripheral-light shielding part inserted between said second light emitting part and said holding part, for blocking out light which is emitted from said first light emitting part, not entering a substrate held by said holding part, and goes toward said second light emitting part;
said peripheral-light shielding part comprises:
a plate-like member inserted in parallel with a substrate held by said holding part, and said plate-like member comprises
a window hole formed in its surface area, having a size equal to or smaller than that of a projection image of said substrate, which is orthographically projected on the surface area.

7. The heat treatment apparatus according to claim 1, wherein
the separation distance between said plate-like member and a substrate held by said holding part is not longer than 30 mm.

8. The heat treatment apparatus according to claim 7, wherein
said plate-like member is formed of silicon carbide.

9. The heat treatment apparatus according to claim 7, wherein
said plate-like member is formed of alumina.

10. The heat treatment apparatus according to claim 7, wherein
said plate-like member is formed of a material that does not transmit light of visible region.

* * * * *